(12) United States Patent
Ivanov

(10) Patent No.: US 6,562,207 B1
(45) Date of Patent: *May 13, 2003

(54) REFRACTORY METAL SILICIDE ALLOY SPUTTER TARGETS, USE AND MANUFACTURE THEREOF

(75) Inventor: Eugene Y. Ivanov, Grove City, OH (US)

(73) Assignee: Tosoh SMD, Inc., Grove City, OH (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/462,856
(22) PCT Filed: Jul. 10, 1998
(86) PCT No.: PCT/US98/14383
   § 371 (c)(1),
   (2), (4) Date: Jan. 14, 2000
(87) PCT Pub. No.: WO99/03623
   PCT Pub. Date: Jan. 28, 1999

Related U.S. Application Data

(60) Provisional application No. 60/052,533, filed on Jul. 15, 1997, and provisional application No. 60/080,874, filed on Apr. 6, 1998.

(51) Int. Cl.[7] .................. C23C 14/34; C22C 14/00; C22C 38/02; C22C 38/12; C22C 38/14
(52) U.S. Cl. .................. 204/298.13; 204/298.12; 204/192.17; 204/192.21; 204/192.22; 204/192.23; 419/10; 419/23; 419/48; 419/49; 420/117; 420/118; 420/122; 420/123; 420/126; 420/127; 420/417; 420/427; 420/429; 420/430
(58) Field of Search .............. 419/10, 23, 48, 419/49; 420/117, 118, 122, 123, 126, 127, 417, 427, 429, 430; 204/192.17, 192.21, 192.22, 192.23, 298.12, 298.13

(56) References Cited

U.S. PATENT DOCUMENTS

| | | | |
|---|---|---|---|
| 4,051,297 A | 9/1977 | Veigel | 428/336 |
| 4,619,697 A | * 10/1986 | Hijikata et al. | 419/10 |
| 4,663,120 A | * 5/1987 | Parent et al. | 419/10 |
| 4,750,932 A | 6/1988 | Parent et al. | 75/228 |
| 4,760,369 A | 7/1988 | Tiku | 338/308 |
| 4,938,798 A | * 7/1990 | Chiba et al. | 419/10 |
| 5,106,786 A | * 4/1992 | Brady et al. | 438/655 |
| 5,294,321 A | 3/1994 | Satou et al. | 204/298.13 |
| 5,418,071 A | * 5/1995 | Satou et al. | 419/10 |
| 5,447,616 A | * 9/1995 | Satou et al. | 204/298.13 |
| 5,460,793 A | 10/1995 | Kano et al. | 423/344 |
| 5,464,520 A | 11/1995 | Kano et al. | 204/292.13 |
| 5,508,000 A | * 4/1996 | Satou et al. | 419/31 |
| 5,618,397 A | 4/1997 | Kano et al. | 204/298.13 |

FOREIGN PATENT DOCUMENTS

| | | | |
|---|---|---|---|
| EP | 0608551 | 8/1994 | |
| EP | 0616045 | 9/1994 | |
| JP | 62-150822 | * 7/1987 | 204/298.12 |
| JP | 63179061 | 7/1988 | |
| JP | 6439374 | 2/1989 | |
| JP | 234919 | 2/1990 | |
| JP | 247261 | 2/1990 | |
| JP | 234379 | 10/1990 | |
| JP | 5230644 | 9/1993 | |
| JP | 9111363 | 4/1997 | |

OTHER PUBLICATIONS

Inter Press, Dictionary of Science and Engineering, English–Japanese, Japanese–English, the Third Edition, 1990, pp. 170.*

Kolawa, E., et al., "Tantalum–based Diffusion Barriers in Si/Cu VLSI Metallizations," *J. Applied Physics*, vol. 70, (3) Aug. 1991, pp. 1369–1373.

Harper, J.M.E., et al., "Materials Issues in Copper Interconnections", *MRS Bulletin*, Aug. 1994, pp. 23–29.

Wang, S.–Q., "Barriers Against Copper Diffusion into Silicon and Drift Through Silicon Dioxide", *MRS Bulletin*, Aug. 1994, pp. 30–39.

Haji–Mahmood, M.S., et al., "Processing and Characterization of Nanocrystalline Molybdenum Disilicide Consolidated by Hot Isostatic Pressing (HIP)", *NanoStructured Materials*, vol. 7, Nos. 1 / 2, 1996, pp. 95–112.

Noya, A., et al., "Transmission Electron Microscopy of the Sequence of Phase Formation in the Interfacial Solid–Phase Reactions in Ta/Si Systems", *J. Vac Science Techology*, A 15(2), Mar./Apr. 1997, pp. 253–257.

* cited by examiner

*Primary Examiner*—Rodney G. McDonald
(74) *Attorney, Agent, or Firm*—Wegman, Hessler & Vanderburg

(57) ABSTRACT

Sputter target, method of manufacture of same and sputter coating process using the target as a sputtering source are disclosed. The sputter target comprises an Me/Si multiphase, consolidated blend wherein the Si component is present in a very small amount of about trace—0.99 mole Si:1 mole Me. Preferably, Me comprises one or more of Ta, Ti, Mo, or W. The targets are made from the requisite powders via HIP consolidation to provide densities of greater than 98 % of the theoretical density. The targets are especially useful in reactive cathodic sputtering systems employing $N_2$ as the reactive gas to form amorphous Me/Si/N layers.

24 Claims, No Drawings

REFRACTORY METAL SILICIDE ALLOY SPUTTER TARGETS, USE AND MANUFACTURE THEREOF

RELATED APPLICATIONS

The benefit of prior U.S. provisional applications Ser. No. 60/052,533 filed Jul. 15, 1997 and Ser. No. 60/080,874 filed Apr. 6, 1998 is claimed.

BACKGROUND OF THE INVENTION

Copper has attracted attention as an interconnect material as a replacement for Al and Al alloys in deep submicron integrated circuits (ICs). The major motivating factors for this are copper's lower resistivity, superior electromigration and stress migration resistance relative to Al and its alloys. However, use of Cu metallization is not without problems. For example, Cu suffers from a lack of anisotropic etching ability, oxidation and corrosion problems, and poor adhesion to many dielectric layer. One particularly troublesome problem is the diffusion of Cu into either the Si or $SiO_2$ layers.

In the quest to find suitable diffusion barrier layers for Cu metallizations, amorphous Ti—Si—N, Mo—Si—N, W—Si—N and Ta—Si—N layers have been investigated. Among these materials, tantalum based layers presently appear promising since they exhibit a relatively high melting temperature and are also relatively thermodynamically stable with Cu. Accordingly, significant interest exists in the use of Ta—Si—N as an amorphous barrier layer for Cu metallization in semiconductors.

Tantalum silicon alloys and intermetallic compounds are used in PVD processes to provide the desired Ta/Si layers. Typically Ta/Si targets are sputtered in a reactive (e.g. $N_2$) atmosphere to result in the formation of the desired Ta—Si—N coating. Tantalum silicide alloys are commonly prepared by blending Ta and Si, usually in powder form, reacting the blend at high temperature under vacuum conditions, crushing, milling, and screening the tantalum silicide powder. These methods can be used to form known, brittle intermetallic compounds such as $TaSi_2$ or mixtures of such intermetallic compounds with Si. Tantalum silicides having the empirical formula $TaSi_y$ wherein y<1 prepared by such methods are very hard alloys and cannot be milled efficiently into a powder and it is difficult to make high density targets with these materials.

Also, it is difficult to obtain full density with targets composed of $Ta_5Si_3$ and $TaSi_2$ due to the high melting points of these crystalline compounds (e.g., 2560° C. and 2040° C. respectively).

For most PVD applications, a fine microstructure (or small grain size of the target material) and full density targets are required. As stated above, Ta/Si alloys with a very low content (0–10 wt %) of Si are difficult to manufacture. However, it is desirable to make targets from such alloys to inhibit silicide formation during sputtering and so that amorphous Ta/Si/N layers can be deposited via sputter coating to provide the necessary diffusion barrier layers in Cu and other metallization semiconductor circuits.

Accordingly, there is a need in the art to provide for high density TaSi sputter targets wherein the Si is present in a very low (less than or equal to about 10 wt %) amount.

SUMMARY OF THE INVENTION

Low Si content Me/Si targets (Me=refractory metal such as Ta, W, and/or Mo and combinations thereof) are provided. Preferably, the Si component is present in an amount of less than 10 wt %.

This method uses high purity Me and Si (e.g., Ta and Si) in form of powders formulated to the desirable composition. The Si can be present as an elemental powder or in the form of a metallic silicide. Preferably, this method consists of blending Me and Si (e.g., Ta and Si), loading them into a HIP can, evacuating the HIP can, and subjecting the powders to HIP conditions. Preferably, this blend includes any desirable amount of Me and Si (e.g., Ta and Silicon) and is HIPed to form a solid blank of Me—Si (Ta—Si) alloy.

Sputter targets used for this process are those comprised of $Ta Si_{0.X}$ wherein X is from trace to about 99, preferably trace to 6, more preferably 1–6, with present data suggesting that about 3–6 is most preferred. Targets under specific investigation that have proven beneficial are:

$TaSi_{0.1}$
$TaSi_{0.4}$
$TaSi_{0.6}$

Preferably the targets are made from the powders, preferably −80 to −240 mesh, most preferably about −100 to −200 mesh. In some instances it will be necessary to ball mill the powder. The particles are blended together and then HIPed so as to obtain preferably greater than about 98% theoretical density, more preferably greater than about 99% theoretical density, most preferably about 99.5% theoretical density. HIPing is generally conducted at about 20,000–40,000 psi at temperatures of about 1100–1350° C. for about 1–4 hours.

After HIPing, the targets can be shaped into the final needed target shape such as rectangular flat panels, circular targets, conical targets etc. via light machining or the like. The targets have shown promise in reactive sputtering systems and applications wherein $N_2$ is the reactive gas.

In addition to Ta/Si targets, other transition metals may be substituted for the Ta. A listing of such other metals includes W, Mo, and Ti.

Accordingly the following targets may be made via the inventive methods $MeSi_{0.X}$ wherein Me is a transition metal, preferably taken from the groups IVb, Vb, and VIb of the Periodic Table of Elements (CAS Version), more preferably Ta, W, Mo, Ti, most preferably Ta. X in the above formula may be from about trace—99, trace—6, preferably 1–6 and most preferably 3–6.

The prior art mentions $Ta_5Si_3$ targets and their use to sputter improved diffusion barrier layers. However, it is thought that this composition comprises intermetallic compound $Ta_5Si_3$. In contrast, targets in accordance with the invention are multi-phase.

The targets of the invention are used in conventional sputter coating equipment, preferably with $N_2$ used as the reactive gas, thereby sputter coating the desired substrate with a layer of amorphous Me—Si—N.

EXAMPLES

Example 1

$TaSi_{0.1}$

Ta powder −100 mesh and Si powder −100 mesh were blended to the composition Ta—1.53 wt %Si, placed into a HIP can protected with alumina plasma coat and BN inside, evacuated and HIPed at 30,000 psi and 1200C for 3 hours. The density of this material was 93.5%.

Example 2

$TaSi_{0.6}$

Ta powder −100 mesh and TaSi2 powder −200 mesh were blended to the composition Ta—8.52 wt %Si, placed into a HIP can protected with alumina plasma coat and BN inside, evacuated and HIPed at 30,000 psi and 1200C for 3 hours. The density of this material was 99.5%.

Example 3–5

In this study, $TaSi_{01}$, $TaSi_{0.4}$ and $TaSi_{0.6}$ targets were made and used for reactive sputtering at various $N_2$/Ar ratios.

Tantalum silicide $TaSi_{0.X}$ samples were fabricated by two methods. The $TaSi_0$ Xfirst involved blending of Ta powder (–100 mesh, 3N5) and silicon powder (–200 mesh, 5N) and then hot isostatically pressing (HIP) the mixture at 1179–1310° C. at 107–214 MPa for 10.8–14.4 ksec. The second process involved blending Ta powder with $TaSi_2$ powder and then HIPing the mixture as indicated above. The third procedure used HIP of powdered $Ta_5Si_3$ intermetallic compound (–100 mesh, 3N7). Targets of 3" and 12" were used for sputtering experiments. Ta—Si—N amorphous films of about 500 nm thickness were deposited onto (100) Si substrates by using dc magnetron sputtering at various $N_2$/Ar gas ratios. During deposition, the operating pressure was maintained at 10 mTorr.

The reaction between the Ta metal and Si or Ta and $TaSi_2$ that occurred in the HIP can resulted in the formation of a number of phases. XRD study of the phase composition of $TaSi_{0.4}$ and $TaSi_{0.6}$ samples showed presence of a Ta (Si) solid solution with increased lattice parameter of Ta (from 0.3306 nm to 0.3320 nm) and intermetallic compounds $Ta_5Si_3$, $TaSi_2$ and possibly a less identified phase of $TaSi_{0.6}$. Both of these methods resulted in a similar multi-phase composition; however the Ta—$TaSi_2$ blend resulted in better density after HIPing.

At higher $N_2$ concentrations during reactive sputtering, the films started to form tantalum nitride compounds. All films obtained during reactive sputtering of $TaSi_{0.4}$ and $TaSi_{0.6}$ targets were amorphous. Specific compositions of the films are shown in the following table 1.

TABLE 1

Film composition deposited by reactive sputtering of $TaSi_x$ targets

| Target | 10% N2 | | | 15% N2 | | | 50% N2 | | |
|---|---|---|---|---|---|---|---|---|---|
| Composition | Ta | Si | N | Ta | Si | N | Ta | Si | N |
| $TaSi_{0.1}$ | 48 | 3 | 47 | | | | | | |
| $TaSi_{0.4}$ | | | | 38 | 19 | 43 | | | |
| $TaSi_{0.6}$ | 42 | 20 | 37 | 29 | 24 | 47 | 19 | 23 | 58 |

Ta/Si/N given in weight %.

Results indicated that the amount of $N_2$ in the sputtering gas can be used to change the resistivity of the amorphous Ta—Si—N films to desired values. With increasing amounts of $N_2$ in the sputtering gas, the resistivity of the film increased. Also, preliminary results indicate that undesirable particulate emission is minimized with increasing density and refined microstructure of the target material. Based on currently available data, the optimal concentration for Ta/Si targets is $TaSi_{0.X}$ wherein X is about 3–about 6.

In addition to use of the targets and methods of the invention to form amorphous barrier layers in semiconductor fabrication, targets in accordance with the invention may be used to form Ta layers on x-ray masks and the like for example in conjunction with submicron x-ray lithography.

Although this invention has been described in connection with specific forms thereof, it will be readily apparent that a wide variety of equivalents may be substituted for those specific forms and steps of operation shown and described herein, all without departing from the spirit and scope of this invention as defined in the appended claims.

What is claimed is:

1. Method of making a sputter target comprising
   a) selecting a Me powder from the group consisting of metals of groups IVb, Vb, and VIb of the periodic table of elements;
   b) selecting a Si powder, and blending it with said Me powder so that said Me powder and said Si powder has a molar ratio of Si:Me of about 0.3 to about 0.6 to 1;
   c) subjecting said blend of Me powder and Si powder to hot isostatic pressure conditions to consolidate said blend to greater than about 98% of the theoretical density of said blend; and
   d) forming said consolidated blend into a desired target shape.

2. Method as recited in claim 1 wherein Me is selected from the group consisting of Ta, Ti, Mo and W.

3. Method as recited in claim 1 wherein said Me and Si powders are both between about –80 mesh to –240 mesh.

4. Method as recited in claim 1 wherein said blend is consolidated to greater than about 99% of its theoretical density.

5. Method as recited in claim 4 wherein said blend is consolidated to greater than about 99.5% of its theoretical density.

6. Method as recited in claim 3 wherein said Me and Si powders are both between about –100 to –200 mesh.

7. Method as recited in claim 1 wherein said hot isostatic pressure conditions include a temperature of about 1100–1350° C. and a pressure of about 20,000–40,000 psi.

8. Method of making a sputter target, said method comprising:
   a) blending Ta powder and a Si powder in a ratio so as to form a blend of $TaSi_{0.X}$, wherein X is about 3 to about 6.
   b) subjecting said blend to hot isostatic pressure conditions to consolidate said blend to greater than about 98% of its theoretical density; and
   c) forming said consolidated blend into a desired target shape.

9. Method as recited in claim 8 wherein said Ta and Si powders are both between about –100 to –200 mesh, said blend being consolidated by said hot isostatic pressure conditions to greater than about 99% of its theoretical density, and said hot isostatic pressure conditions including a temperature of about 1100–1350° C., and a pressure of about 20,000–40,000 psi.

10. Method as recited in claim 9 wherein said blend has the formula $TaSi_{0.4}$.

11. Method as recited in claim 9 wherein said blend has the formula $TaSi_{0.6}$.

12. Sputter target comprising a consolidated, multi-phase blend of $MeSi_{0.X}$ wherein X=about 3 to about 6 and wherein Me is selected from the group consisting of groups IVb, Vb, and VIb of the periodic table of elements, said blend being substantially devoid of significant amount of intermetallic compounds, said blend having a density of about 98% or greater of its theoretical density.

13. Sputter target as recited in claim 12 wherein Me is chosen from Ta, Ti, Mo, and W.

14. Sputter target as recited in claim 13 wherein Me is Ta.

15. Sputter target as recited in claim 14 wherein X is about 4.

16. Sputter target as recited in claim 14 wherein X is about 6.

17. A method of forming an amorphous Me/Si/N layer on a desired substrate wherein Me is chosen from the group consisting of elements taken from groups IVb, Vb, and VIb of the periodic table of elements, said method comprising:
   a) providing a sputter target comprising a consolidated, multi-phase blend of MeSi$_{0.X}$ wherein X is about 3–about 6, said blend having a density of about 98% or greater of its theoretical density;
   b) providing a substrate;
   c) subjecting said substrate and said target to sputtering conditions and sputter coating said substrate with material from said target in the presence of N$_2$ as a reactive gas to provide a thin layer of said Me/Si/N thereon.

18. A method as recited in claim 17 wherein Me is a member selected from the group consisting of Ta, Ti, Mo and W.

19. A method as recited in claim 18 wherein Me is Ta.

20. A method as recited in claim 19 wherein said substrate comprises a copper metallized semiconductor chip.

21. A method as recited in claim 19 wherein said substrate comprises an x-ray mask.

22. Method of making a sputter target having the formula Me/Si$_{0.X}$ wherein X is about 3 to about 6 and wherein Me is selected form the group consisting of metals of Groups IVb, Vb, and VIb of the periodic table of elements, comprising selecting a MeSi powder;

selecting an Me powder;

blending said MeSi powder and said Me powder to provide a blended combination so that said Si is present in said blended combination in a molar amount Si:Me of about 0.3 to about 0.6;

subjecting said blended combination to hot isostatic pressure conditions to consolidate said combination to greater than about 98% of its theoretical density; and forming said consolidated blend into a desired target shape.

23. Method as recited in claim 22 wherein said MeSi powder is intermetallic TaSi$_2$ powder and said Me powder is Ta powder.

24. Method of making a sputter target comprising:

providing Ta powder and TaSi$_2$ powder, blending said powders to provide a blended combination of TaSi$_X$ wherein X=about 0.3 to about 0.6, subjecting said blended combination to hot isostatic pressure conditions to form a multi-phase target composition having a density that is greater than about 98% of its theoretical density; and forming said consolidated blend into a desired target shape.

* * * * *